(12) United States Patent
Shibui

(10) Patent No.: US 7,674,566 B2
(45) Date of Patent: Mar. 9, 2010

(54) POSITIVE PHOTOSENSITIVE RESIN COMPOSITION

(75) Inventor: Satoshi Shibui, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 123 days.

(21) Appl. No.: 12/091,122

(22) PCT Filed: Oct. 20, 2006

(86) PCT No.: PCT/JP2006/320965

§ 371 (c)(1),
(2), (4) Date: Apr. 22, 2008

(87) PCT Pub. No.: WO2007/049524

PCT Pub. Date: May 3, 2007

(65) Prior Publication Data

US 2009/0233228 A1    Sep. 17, 2009

(30) Foreign Application Priority Data

Oct. 26, 2005  (JP) ............................. 2005-311248
Jul. 12, 2006  (JP) ............................. 2006-191014

(51) Int. Cl.
  *G03F 7/023*  (2006.01)
  *G03F 7/30*  (2006.01)
(52) U.S. Cl. .................. 430/191; 430/192; 430/193; 430/270.1; 430/326; 430/330
(58) Field of Classification Search .................. 430/18, 430/191, 192, 193, 270.1, 326, 330
See application file for complete search history.

(56) References Cited

U.S. PATENT DOCUMENTS 5,021,320 A   6/1991  Mueller et al. .............. 430/192
6,960,420 B2 * 11/2005  Komatsu ................. 430/270.1

FOREIGN PATENT DOCUMENTS

| JP | 63-96162 | 4/1988 |
| JP | 9-160234 | 6/1997 |
| JP | 10-307399 | 11/1998 |
| JP | 2000-187327 | 7/2000 |
| JP | 2005-49661 | 2/2005 |
| JP | 2005-220059 | 8/2005 |
| JP | 2005-250160 | 9/2005 |

OTHER PUBLICATIONS

English language Abstract of JP 2005-220059.
English language Abstract of JP 2005-250160.
English language Abstract of JP 10-307399.
English language Abstract of JP 9-160234.
English language Abstract of JP 63-96162.
English language Abstract of JP2000-187327.
English language Abstract of JP 2005-49661.

* cited by examiner

*Primary Examiner*—John S Chu
(74) *Attorney, Agent, or Firm*—Greenblum & Bernstein, P.L.C.

(57) ABSTRACT

The present invention provides a positive photosensitive resin composition, characterized by comprising 1 to 50 parts by mass of a photo-acid generator and 0.01 to 70 parts by mass of a terpene compound in combination with 100 parts by mass of a hydroxypolyamide having repeating units. A terpene compound can be combined with a hydroxypolyamide having a particular structure to provide a positive photosensitive resin composition excellent in positive lithography performance such as sensitivity and resolution.

19 Claims, No Drawings

POSITIVE PHOTOSENSITIVE RESIN COMPOSITION

TECHNICAL FIELD

The present invention relates to a positive photosensitive resin composition serving as a precursor of a heat-resistant resin used as a surface protection film and interlayer insulating film for semiconductor devices, to a process for producing a heat-resistant cured relief pattern employing the positive photosensitive resin composition, and to a semiconductor device having the cured relief pattern.

BACKGROUND ART

A polyimide resin, which combines excellent heat resistance, electrical properties, mechanical properties, and the like, is widely used in surface protection films and interlayer insulating films for semiconductor devices. Generally, the polyimide resin is now often provided in the form of a photosensitive polyimide precursor composition. In the process of producing a semiconductor device, the precursor composition can be coated on a substrate such as a silicon wafer, patterned with an active light, developed, and subjected to heat imidization treatment or the like to easily form a surface protection film, an interlayer insulating film, or the like serving as a part of the semiconductor device. Thus, the process for producing a semiconductor device using the photosensitive polyimide precursor composition has a feature that it enables production steps to be significantly reduced compared to a conventional production process therefor employing a nonphotosensitive polyimide precursor composition, which requires the formation of a surface protection film or the like before patterning by lithography.

However, the photosensitive polyimide precursor composition requires the use of an organic solvent such as N-methyl-2-pyrolidone as a developing solution in the process of the development thereof. As a result, there has been a need for such a countermeasure that the organic solvent is removed in view of increased recent concern over environmental issues, and the like. In response to the need, various proposals have been made in which heat-resistance photosensitive resin materials are used which can be developed with an alkaline aqueous solution as is the case with a photoresist.

Among others, attention has been given in recent years to a method disclosed, for example, in Patent Document 1, which involves mixing an alkaline aqueous solution-soluble hydroxypolyamide becoming a heat-resistant resin after being cured, for example, a polybenzoxazole (hereinafter also referred to as "PBO") precursor, with a photo-acid generator such as a photosensitive diazoquinone compound to make a PBO precursor composition, and using the PBO precursor composition as a positive photosensitive resin composition.

The mechanism for developing the positive photosensitive resin composition exploits that whereas the photosensitive diazoquinone compound and PBO precursor in unexposed areas have low rates of dissolution in an alkaline aqueous solution, the exposure induces the chemical change of the photosensitive diazoquinone compound into an indene carboxylic acid compound to increase the rate of dissolution of exposed areas in the alkaline aqueous solution. The difference in the rate of dissolution in a developing solution between the exposed and unexposed areas can be used to form a relief pattern consisting of the unexposed areas.

The above PBO precursor composition can be exposed and developed with an alkaline aqueous solution to form a positive relief pattern. In addition, heat produces the formation of an oxazole ring to allow a PBO film after curing to come to have heat-cured film characteristics comparable to those of a polyimide film. Thus, the PBO precursor composition has received attention as a promising alternative material for an organic solvent-developed polyimide precursor composition.

However, the PBO precursor composition has a problem that it is low in sensitivity compared to the photosensitive polyimide precursor composition; there is a need for a composition having higher sensitivity.

Patent Document 1: JP-A-63-096162

DISCLOSURE OF THE INVENTION

Problems to be Solved by the Invention

An object of the present invention is to provide a positive photosensitive resin composition excellent in positive lithography performance such as sensitivity and resolution, a process for producing a cured relief pattern using the composition, and a semiconductor device having the cured relief pattern.

Means for Solving the Problems

The present inventor has found that a terpene compound is combined with a hydroxypolyamide having a particular structure to provide a positive photosensitive resin composition solving the above problems, thereby accomplishing the present invention.

Specifically, a first aspect in accordance with the present invention is a positive photosensitive resin composition, characterized by comprising 1 to 50 parts by mass of a photo-acid generator and 0.01 to 70 parts by mass of a terpene compound in combination with 100 parts by mass of a hydroxypolyamide having repeating units represented by the general formula (1) below.

[Formula 1]

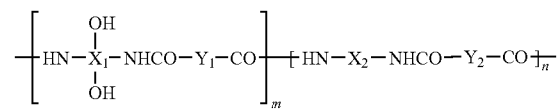

In the formula, $X_1$ represents a tetravalent organic group having at least two carbon atoms; $X_2$, $Y_1$ and $Y_2$ each independently represent a divalent organic group having at least two carbon atoms; m represents an integer of 2 to 1,000; n represents an integer of 0 to 500; $m/(m+n) > 0.5$; and m units of dihydroxydiamide containing $X_1$ and $Y_1$ and n units of diamide containing $X_2$ and $Y_2$ may be sequenced in any order.

In the composition of the present invention, the terpene compound is preferably an organic compound having at least one functional group selected from the group consisting of an alcoholic hydroxyl group, a carbonyl group, a carboxyl group, an ester group, and an ether group. More preferably, the terpene compound is a compound having at least one functional group selected from the group consisting of an alcoholic hydroxyl group, a carboxyl group, and an ester group. In addition, the terpene compound is preferably an open-chain terpene. Further, the terpene compound is most preferably a mixture of at least two compounds including any one compound selected from the group consisting of citronellic acid and linalool and a compound having any one functional group selected from the group consisting of an alcoholic hydroxyl group, a carboxyl group, and an ester group. The photo-acid generator is preferably a compound having a naphthoquinonediazide structure.

A second aspect in accordance with the present invention is a process for producing a cured relief pattern, characterized by comprising: (1) forming the above positive photosensitive resin composition in the form of a layer or film on a substrate, (2) exposing the substrate to actinic rays via a mask or directly irradiating the substrate with light, electron beams or ion beams, (3) eluting and removing the exposed or irradiated areas with a developing solution, and (4) subjecting the resultant relief pattern to heat treatment.

A third aspect in accordance with the present invention is a semiconductor device characterized by having the above cured relief pattern layer.

Advantages of the Invention

According to the present invention, there are provided a positive photosensitive resin composition excellent in positive lithography performance such as sensitivity and resolution, a process for producing a cured relief pattern using the positive photosensitive resin composition, and a semiconductor device having the cured relief pattern.

BEST MODE FOR CARRYING OUT THE INVENTION

<Positive Photosensitive Resin Composition>

The components constituting the positive photosensitive resin composition of the present invention will be specifically described below.

(A) Hydroxypolyamide

The hydroxypolyamide which is a base polymer for the positive photosensitive resin composition of the present invention has m units of dihydroxydiamide in the general formula (1) below.

The dihydroxydiamide unit has a structure in which a dicarboxylic acid having a structure of $Y_1(COOH)_2$ is polycondensated with a bisaminophenol having a structure of $X_1(NH_2)_2(OH)_2$. The two pairs of the amino and hydroxy groups of the bisaminophenol are each at the ortho position relative to each other. The dihydroxydiamide is cyclized by heating at about 280 to 400° C. and thereby changed into a polybenzoxazole which is a heat-resistant resin. m is preferably in the range of 2 to 1,000, more preferably in the range of 3 to 50, most preferably in the range of 3 to 30.

[Formula 2]

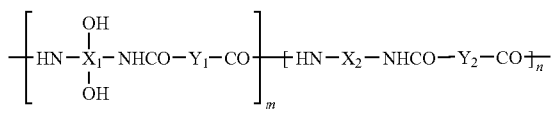

(1)

The dihydroxydiamide may optionally have n units of diamide in the above the general formula (1). The diamide unit has a structure in which a diamine having a structure of $X_2(NH_2)_2$ is polycondensated with a dicarboxylic acid having a structure of $Y_2(COOH)_2$. n is preferably in the range of 0 to 500, more preferably in the range of 0 to 10.

A higher proportion of the dihydroxydiamide unit in the hydroxypolyamide enhances the solubility in an alkaline aqueous solution used as a developing solution. Thus, m/(m+n) is preferably more than 0.5, more preferably 0.7 or more, most preferably 0.8 or more.

Examples of the bisaminophenol having a structure of $X_1(NH_2)_2(OH)_2$ include 3,3'-dihydroxybenzidine, 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis-(3-amino-4-hydroxyphenyl)methane, 2,2-bis-(3-amino-4-hydroxyphenyl)propane, 2,2-bis-(3-amino-4-hydroxyphenyl)hexafluoropropane, 2,2-bis-(4-amino-3-hydroxyphenyl)hexafluoropropane, bis-(4-amino-3-hydroxyphenyl)methane, 2,2-bis-(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, and 1,3-diamino-4,6-dihydroxybenzene. These bisaminophenols may be used alone or in a mixture thereof.

Among the bisaminophenols having a structure of $X_1(NH_2)_2(OH)_2$, particularly preferred is a bisaminophenol in which $X_1$ is an aromatic group selected from the following.

[Formula 3]

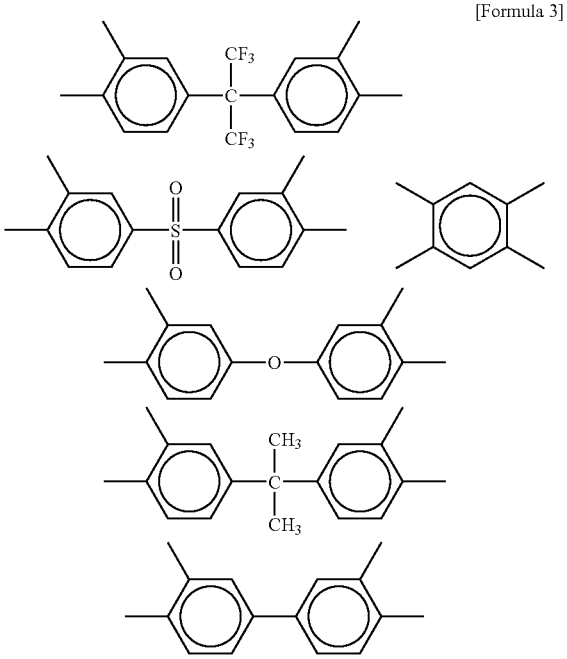

A diamine intramolecularly having two pairs of an amide bond and a phenolic hydroxyl group at the ortho position relative to each other (hereinafter referred to as "a diamine intramolecularly having a PBO precursor structure") may also be used as the compound of a structure of $X_1(NH_2)_2(OH)_2$. Examples thereof include a diamine represented by the following general formula, which is obtained by reacting two molecules of nitrobenzoic acid with a bisaminophenol having the above $X_1(NH_2)_2(OH)_2$ structure to reduce the bisaminophenol.

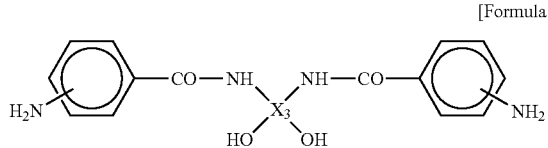

[Formula 4]

In the formula, $X_3$ represents a tetravalent organic group having at least two carbon atoms, and preferably represents at least one organic group selected from the group consisting of the above-described groups preferable as organic groups represented by $X_1$.

Alternatively, the diamine intramolecularly having a PBO precursor structure is also obtained by a method which involves reacting two molecules of nitroaminophenol with a dicarboxylic acid dichloride having a structure of $Y_3(COCl)_2$ for reduction to provide a diamine represented by the following general formula.

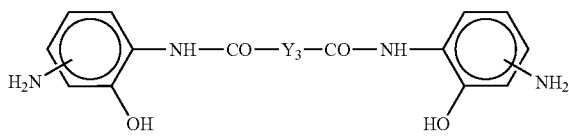

[Formula 5]

In the formula, $Y_3$ represents a divalent organic group having at least two carbon atoms, and preferably represents at least one organic group selected from the group consisting of groups preferable as organic groups represented by $Y_1$ to be described later.

Examples of the diamine having a structure of $X_2(NH_2)_2$ include an aromatic diamine and a silicon diamine.

Among these, examples of the aromatic diamine include m-phenylenediamine, p-phenylenediamine, 2,4-tolylenediamine, 3,3'-diaminodiphenyl ether, 3,4'-diaminodiphenyl ether, 4,4'-diaminodiphenyl ether, 3,3'-diaminodiphenylsulfone, 4,4'-diaminodiphenylsulfone, 3,4'-diaminodiphenylsulfone, 3,3'-diaminodiphenylmethane, 4,4'-diaminodiphenylmethane, 3,4'-diaminodiphenylmethane, 4,4'-diaminodiphenyl sulfide, 3,3'-diaminodiphenyl ketone, 4,4'-diaminodiphenyl ketone, 3,4'-diaminodiphenyl ketone, 2,2'-bis(4-aminophenyl)propane, 2,2'-bis(4-aminophenyl)hexafluoropropane, 1,3-bis(3-aminophenoxy)benzene, 1,3-bis(4-aminophenoxy)benzene, 1,4-bis(4-aminophenoxy)benzene, 4-methyl-2,4-bis(4-aminophenyl)-1-pentene, 4-methyl-2,4-bis(4-aminophenyl)-2-pentene, 1,4-bis(α,α-dimethyl-4-aminobenzyl)benzene, imino-di-p-phenylenediamine, 1,5-diaminonaphthalene, 2,6-diaminonaphthalene, 4-methyl-2,4-bis(4-aminophenyl)pentane, 5(or 6)-amino-1-(4-aminophenyl)-1,3,3-trimethylindan, bis(p-aminophenyl)phosphine oxide, 4,4'-diaminoazobenzene, 4,4'-diaminodiphenylurea, 4,4'-bis(4-aminophenoxy)biphenyl, 2,2-bis[4-(4-aminophenoxy)phenyl]propane, 2,2-bis[4-(4-aminophenoxy)phenyl]hexafluoropropane, 2,2-bis[4-(3-aminophenoxy)phenyl]benzophenone, 4,4'-bis(4-aminophenoxy)diphenylsulfone, 4,4'-bis[4-(α,α-dimethyl-4-aminobenzyl)phenoxy]benzophenone, 4,4'-bis[4-(α,α-dimethyl-4-aminobenzyl)phenoxy]diphenylsulfone, 4,4'-diaminobiphenyl, 4,4'-diaminobenzophenone, phenylindandiamine, 3,3'-dimethoxy-4,4'-diaminobiphenyl, 3,3'-dimethyl-4,4'-diaminobiphenyl, o-toluidine sulfone, 2,2-bis(4-aminophenoxyphenyl)propane, bis(4-aminophenoxyphenyl)sulfone, bis(4-aminophenoxyphenyl)sulfide, 1,4-(4-aminophenoxyphenyl)benzene, 1,3-(4-aminophenoxyphenyl)benzene, 9,9-bis(4-aminophenyl)fluorene, 4,4'-di-(3-aminophenoxy)diphenylsulfone, 4,4'-diaminobenzanilide, and these aromatic diamines in each of which the hydrogens of the aromatic nucleus are substituted with at least one group or atom selected from the group consisting of a chlorine atom, a fluorine atom, a bromine atom, a methyl group, a methoxy group, a cyano group, and a phenyl group.

To enhance the adhesiveness between the composition and the substrate, a silicon diamine may be selected as the whole or part of the diamine having a structure of $X_2(NH_2)_2$. Examples thereof include bis(4-aminophenyl)dimethylsilane, bis(4-aminophenyl)tetramethylsiloxane, bis(4-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, and bis(γ-aminopropyl)tetraphenyldisiloxane.

Examples of the dicarboxylic acids having structures of $Y_1(COOH)_2$ and $Y_2(COOH)_2$ include dicarboxylic acids in which $Y_1$ and $Y_2$ are each independently an aromatic or aliphatic group selected from the following formulas:

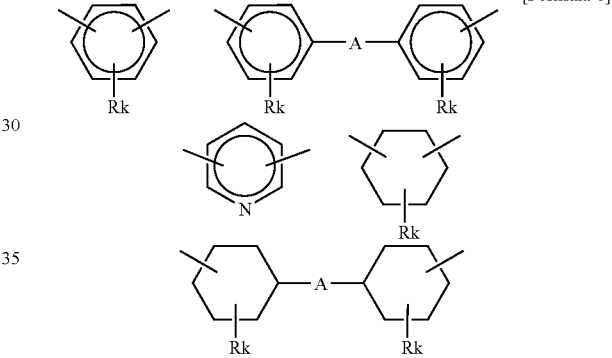

[Formula 6]

In the formulas, A represents a divalent group selected from the group consisting of —$CH_2$—, —O—, —S—, —$SO_2$—, —CO—, —NHCO—, —$C(CF_3)_2$—, and single bonding; R's each independently represent a group selected from the group consisting of a hydrogen atom, an alkyl group, an unsaturated group, and a halogen atom; and k represents an integer of 0 to 4.

A derivative of 5-aminoisophthalic acid may also be used as the whole or part of each of the above $Y_1(COOH)_2$ and $Y_2(COOH)_2$ structures.

Specific examples of the compound allowed to react with 5-aminoisophthalic acid to obtain the derivative include 5-norbornene-2,3-dicarboxylic anhydride, exo-3,6-epoxy-1,2,3,6-tetrahydrophthalic anhydride, 3-ethynyl-1,2-phthalic anhydride, 4-ethynyl-1,2-phthalic anhydride, cis-4-cyclohexene-1,2-dicarboxylic anhydride, 1-cyclohexene-1,2-dicarboxylic anhydride, maleic anhydride, citraconic anhydride, itaconic anhydride, endomethylenetetrahydrophthalic anhydride, methylendomethylenetetrahydrophthalic anhydride, methyltetrahydrophthalic anhydride, allylsuccinic anhydride, isocyanatoethylmethacrylate, 3-isopropenyl-α,α-dimethylbenzyl isocyanate, 3-cyclohexene-1-carboxylic acid chloride, 2-furancarboxylic acid chloride, crotonic acid chloride, cinnamic acid chloride, methacrylic acid chloride, acrylic acid chloride, propiolic acid chloride, tetrolic acid chloride, thiophene-2-acetyl chloride, p-styrenesulfonyl chloride, glycidyl methacrylate, allyl glycidyl ether, methyl chloroformate, ethyl chloroformate, n-propyl chloroformate, isopropyl chloroformate, isobutyl chloroformate, 2-ethoxy chloroformate, sec-butyl chloroformate, benzyl chloroformate, 2-ethylhexyl chloroformate, allyl chloroformate, phenyl chloroformate, 2,2,2-trichloroethyl chloroformate, 2-butoxyethyl chloroformate, p-nitrobenzyl chloroformate, p-methoxybenzyl chloroformate, isobornylbenzyl chloroformate, p-biphenylisopropylbenzyl chloroformate, 2-t-butyloxycarbonyl-oxyimino-2-phenylacetonitrile, S-t-butyloxycarbonyl-4,6-dimethyl-thiopyrimidine, di-t-butyl-dicarbonate, N-ethoxycarbonylphthalimide, ethyldithiocarbonyl chloride, formic acid chloride, benzoyl chloride, p-toluenesulfonic acid chloride, methanesulfonic chloride, acetyl chloride, trityl chloride, trimethylchlorosilane, hexamethyldisilazane, N,O-bis(trimethylsilyl)acetamide, bis(trimethylsilyl)trifluoroacetamide, (N,N-dimethylamino)trimethylsilane, (dimethylamino)trimethylsilane, trimethylsilyl diphenylurea, bis(trimethylsilyl)urea, phenyl isocyanate, n-butyl isocyanate, n-octadecyl isocyanate, o-tolyl isocyanate, 1,2-phthalic anhydride, cis-1,2-cyclohexanedicarboxylic anhydride, and glutaric anhydride.

In addition, a dicarboxylic acid obtained by ring-opening tetracarboxylic dianhydride with a monoalcohol, a monoamine, or the like may be used as the dicarboxylic acid having a $Y_1(COOH)_2$ or $Y_2(COOH)_2$ structure. Here, examples of the monoalcohol include methanol, ethanol, propanol, isopropanol, butanol, t-butanol, and benzylalcohol. Examples of the monoamine include butylamine and aniline. Examples of the tetracarboxylic dianhydride include compounds represented by the following chemical formulas.

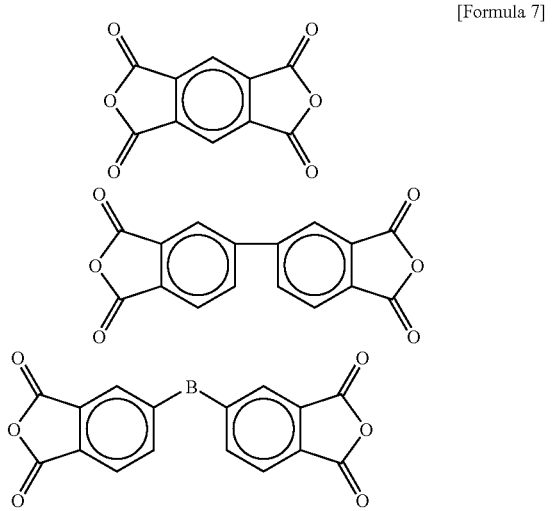

[Formula 7]

In the formula, B represents a divalent group selected from the group consisting of —$CH_2$—, —O—, —S—, —$SO_2$—, —CO—, —NHCO—, and —$C(CF_3)_2$—.

Alternatively, the tetracarboxylic dianhydride may also be reacted with a bisaminophenol or a diamine, followed by esterifying or amidating the generated carboxylic acid residue with a monoalcohol or monoamine.

Trimellitic acid chloride may also be reacted with the bisaminophenol to form a tetracarboxylic dianhydride, which is then ring-opened by the same method as for the above tetracarboxylic dianhydride to use as the dicarboxylic acid. Examples of the tetracarboxylic dianhydride obtained here include a compound represented by the following chemical formula.

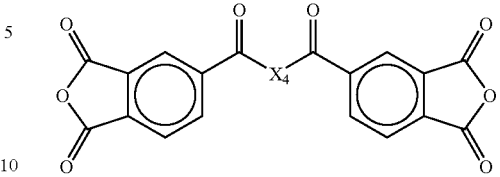

[Formula 8]

In the formula, $X_4$ represents a divalent organic group represented by $X_1(OH)_2(NH—)_2$.

Examples of a method for polycondensing the above-described dicarboxylic acid and bisaminophenol (diamine) to synthesize the hydroxypolyamide include a method involving using the dicarboxylic acid and thionyl chloride to make a diacid chloride, on which the bisaminophenol (diamine) is then allowed to act, or a method involving polycondensing the dicarboxylic acid and bisaminophenol (diamine) using dicyclohexylcarbodiimide. In the method using dicyclohexylcarbodiimide, hydroxybenzotriazole may also be allowed to act simultaneously.

The hydroxypolyamide having repeating units represented by the above the general formula (1) is preferably also used by capping the terminal group thereof with an organic group (hereinafter referred to as "a capping group"). In the polycondensation for forming the hydroxypolyamide, when the dicarboxylic acid component is used in an excess number of moles compared to the sum of those of the bisaminophenol component and diamine component, a compound having an amino group or a hydroxyl group as a capping group is preferably employed. Examples of the compound include aniline, ethynylaniline, norbornene amine, butylamine, propargylamine, ethanol, propargyl alcohol, benzyl alcohol, hydroxyethyl methacrylate, and hydroxyethyl acrylate.

Conversely, when the sum of the bisaminophenol component and diamine component is used in an excess number of moles compared to that of the dicarboxylic acid component, a compound having a group such as acid anhydride, carboxylic acid, acid chloride and isocyanate groups is preferably employed. Examples of the compound include benzoyl chloride, norbornenedicarboxylic anhydride, norbornenecarboxylic acid, ethynylphthalic anhydride, glutaric anhydride, maleic anhydride, phthalic anhydride, cyclohexanedicarboxylic anhydride, methylcyclohexanedicarboxylic anhydride, cyclohexenedicarboxylic anhydride, methacryloyloxyethyl methacrylate, phenyl isocyanate, mesyl chloride, and tosyl chloride.

(B) Photo-Acid Generator

The photo-acid generator contained in the positive photosensitive resin composition of the present invention may be a photosensitive diazoquinone compound, an onium salt, a halogen-containing compound, or the like; preferred is a photosensitive diazoquinone compound.

Examples of the onium salt include an iodonium salt, a sulfonium salt, a phosiphonium salt, a phosphonium salt, an ammonium salt, and a diazonium salt. Among others, preferred are an onium salt selected from the group consisting of a diaryliodonium salt, a triaryliodonium salt, and a trialkylsulfonium salt.

Examples of the halogen-containing compound include a haloalkyl group-containing hydrocarbon compound; preferred is trichloromethyl triazine.

The photosensitive diazoquinone compound is a compound having a 1,2-benzoquinonediazide structure or a 1,2- naphthoquinonediazide structure, which is a known substance described in U.S. Pat. Nos. 2,772,972, 2,797,213, 3,669,658 or the like. Preferred is a compound having a naphthoquinonediazide structure; examples thereof include the following compounds having a naphthoquinonediazide structure.

[Formula 9]

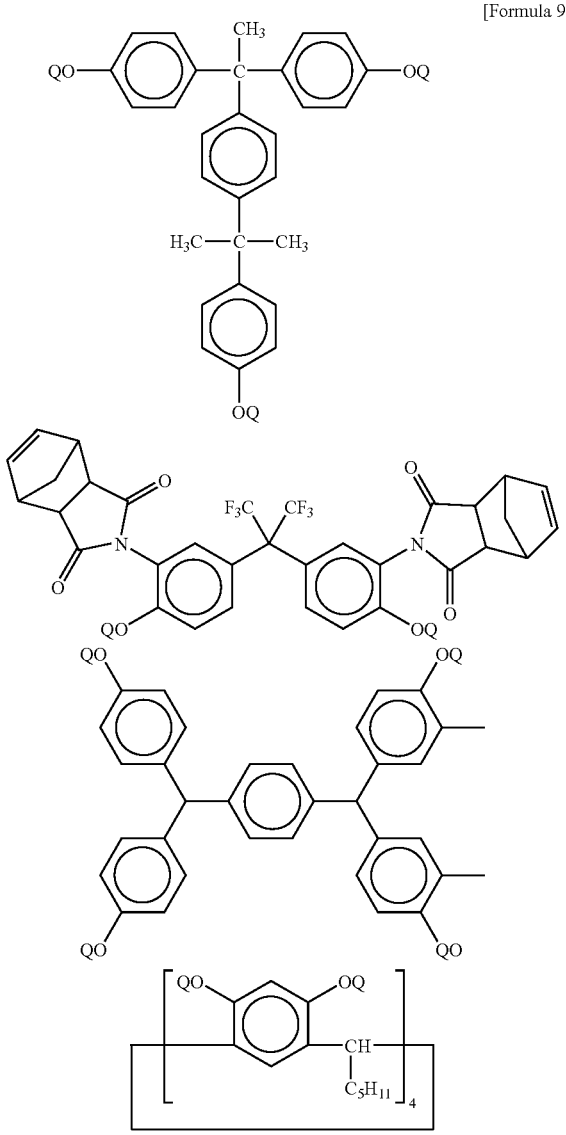

In the formulas, Q's are each a hydrogen atom or a naphthoquinonediazide sulfonate group; and all Q's are not simultaneously hydrogen atoms.

Preferred examples of the naphthoquinonediazide sulfonate group include the following groups.

[Formula 10]

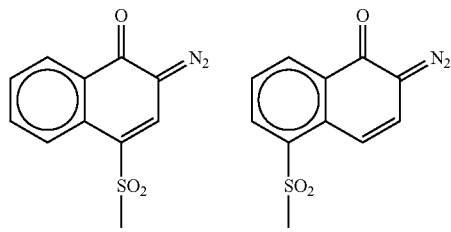

The photo-acid generator is preferably added in an amount of 1 to 50 parts by mass, more preferably 5 to 30 parts by mass to 100 parts by mass of the hydroxypolyamide. Addition of the photo-acid generator of 1 part by mass or more makes the patterning property of the resin favorable; 50 parts by mass or less renders good the tensile elongation of the cured film and reduces the undeveloped residue (scum) of exposed areas.

(C) Terpene Compound

Terpene is a generic term applied to substances which are organic compounds each having carbons in multiples of five obtained from various plants (in rare instances, animals) and, from a biosynthetic viewpoint, are believed to be derived from a precursor composed of n (n≧2) units of isoprene or isopentane. The terpene compound used in the present invention refers to the above terpene, which is preferably an organic compound having at least one functional group selected from the group consisting of an alcoholic hydroxyl group, a carbonyl group, a carboxyl group, an ester group, and an ether group, more preferably a compound having at least one functional group selected from the group consisting of a carboxyl group, an alcoholic hydroxyl group, and an ester group. In addition, the terpene compound is particularly preferably the organic compound having 10 to 30 carbons. The terpene compound is also preferably an open-chain terpene. Further, the terpene compound is most preferably a mixture of at least two compounds including any one compound selected from the group consisting of citronellic acid and linalool and a compound having any one functional group selected from the group consisting of an alcoholic hydroxyl group, a carboxyl group, and an ester group.

Specific examples of the terpene compound include linalool, isophytol, dihydrolinalool, linalyl acetate, linalool oxide, geranyllinalool, lavandulol, tetrahydrolavandulol, acetic acid lavandulyl ester, nerol, neryl acetate, geraniol, citral, geranyl acetate, geranylacetone, geranic acid, citral dimethylacetal, citronellol, citronellal, hydroxycitronellal, dimethyloctanal, citronellic acid, citronellyl acetate, tagetone, artemisia ketone, pulegol, isopulegol, menthol, menthyl acetate, isomenthol, neomenthol, menthanol, menthanetriol, menthanetetraol, carvomenthol, menthoxyacetic acid, perillyl alcohol, perillaldehyde, carveol, piperitol, terpinen-4-ol, terpineol, terpinenol, dihydroterpineol, sobrerol, thymol, bomeol, bornyl acetate, isoborneol, isobornyl acetate, cineol, pinol, pinocarveol, myrtenol, myrtenal, verbenol, pinocampheol, camphorsulfonic acid, nerolidol, terpinene, ionone, pinene, camphene, camphorene aldehyde, camphoronic acid, isocamphoronic acid, camphoric acid, abietic acid, and glycyrrhetic acid. These terpene compounds may be used alone or in a mixture of two or more thereof.

The terpene compound is preferably added in an amount of 0.01 to 70 parts by mass, more preferably 0.1 to 50 parts by mass, particularly preferably 1 to 40 parts by mass to 100 parts by mass of the hydroxypolyamide. Addition of terpene of 0.01 part by mass or more reduces the undeveloped residue of exposed areas; 70 parts by mass or less gives a satisfactory tensile elongation of the cured film.

(D) Other Additives

The positive photosensitive resin composition of the present invention may also optionally contain a phenol compound, a dye, a surfactant, a stabilizer, and/or an adhesive agent auxiliary for enhancing adhesion to a silicon wafer which are known as additives for a positive photosensitive resin composition.

The above additives will be more specifically described. Examples of the phenol compound include a ballast agent used in the above photosensitive diazoquinone compound; para-cumylphenol; bisphenols; resorcinols; linear phenol compounds such as MtrisPC and MtetraPC (manufactured by Honshu Chemical Industry Co., Ltd.: trade name); non-linear phenol compounds such as TrisP-HAP, TrisP-PHBA and TrisP-PA (manufactured by Honshu Chemical Industry Co., Ltd.: trade name); diphenylmethane in which the 2 to 5 hydrogen atoms of the phenyl groups are substituted with hydroxyl groups; and 2,2-diphenylpropane in which the 1 to 5 hydrogen atoms of the phenyl groups are substituted with hydroxyl groups. Addition of the phenol compound enhances the adhesion of a relief pattern during development and can suppress the generation of the residue. The ballast agent refers to a phenol compound used as a raw material in the above photosensitive diazoquinone compound which is a phenol compound in which part of the phenolic hydrogen atoms is naphthoquinone diazide sulfonated.

The phenol compound is optionally added in an amount of preferably 0 to 50 parts by mass, more preferably 1 to 30 parts by mass to 100 parts by mass of the hydroxypolyamide. Addition of 50 parts by mass or less makes the heat-cured film satisfactorily heat-resistant.

Examples of the surfactant include a nonionic surfactant consisting of a polyglycol such as polypropylene glycol and polyoxyethylene lauryl ether, or a derivative thereof. Examples thereof also include a fluorine surfactant such as Florard (trade name, from Sumitomo 3M Ltd.), Megafack (trade name, from Dainippon Ink And Chemicals, Inc.) or Sulfron (trade name, Asahi Glass Co., Ltd.). In addition, examples thereof include an organic siloxane surfactant such as KP341 (trade name, from Shin-Etsu Chemical Co., Ltd.), DBE (trade name, from Chisso Corporation) or Glanol (trade name, from Kyoeisha Chemical Co., Ltd.). Addition of the surfactant makes the coating film less repellent on the wafer edge during the coating.

The surfactant is optionally added in an amount of preferably 0 to 10 parts by mass, more preferably 0.01 to 1 part by mass to 100 parts by mass of the hydroxypolyamide. Addition of 10 parts by mass or less makes the heat-cured film satisfactorily heat-resistant.

Examples of the adhesive agent auxiliary include t-butyl novolac, aluminium compounds, titanium coupling agents, epoxy polymers, and various silane coupling agents such as epoxy silane.

Preferred specific examples of the silane coupling agent include a reaction product of a 3-methacryloxypropyltrialkoxysilane, 3-methacryloxypropyldialkoxyalkylsilane, 3-glycidoxypropyltrialkoxysilane, 3-glycidoxypropyldialkoxyalkylsilane, 3-aminopropyltrialkoxysilane, or 3-aminopropyldialkoxyalkylsilane and an acid anhydride or acid dianhydride, and a 3-aminopropyltrialkoxysilane or 3-aminopropyldialkoxyalkylsilane whose amino group is converted to a urethane or urea group. The alkyl group referred to herein may be, for example, a methyl group, an ethyl group, or a butyl group; the acid anhydride may be, for example, maleic acid anhydride or phthalic acid anhydride; the acid dianhydride may be, for example, pyromellitic acid dianhydride, 3,3',4,4'-benzophenonetetracarboxylic acid dianhydride, or 4,4'-oxydiphthalic acid dianhydride; the urethane group may be, for example, a t-butoxycarbonylamino group; and the urea group may be, for example, a phenylaminocarbonylamino group.

The adhesive agent auxiliary is optionally added in an amount of preferably 0 to 30 parts by mass, more preferably 0.1 to 10 parts by mass to 100 parts by mass of the hydroxypolyamide. Addition of 30 parts by mass or less makes the heat-cured film satisfactorily heat-resistant.

According to the present invention, these components are preferably used as a positive photosensitive resin composition by dissolving them in a solvent to make into varnish form. Examples of the solvent include N-methyl-2-pyrrolidone, γ-butyrolactone (hereinafter also referred to as "GBL"), cyclopentanone, cyclohexanone, isophorone, N,N-dimethylacetamide (hereinafter also referred to as "DMAc"), dimethylimidazolinone, tetramethylurea, dimethyl sulfoxide, diethylene glycol dimethyl ether (hereinafter also referred to as "DMDG"), diethylene glycol diethyl ether, diethylene glycol dibutyl ether, propylene glycol monomethyl ether, propylene glycol monoethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, and methyl-3-methoxypropionate. These solvents may be used alone or in a mixture thereof.

Among these solvents, non-amide solvents are preferable in that they less affect a photoresist and the like. Preferred specific examples thereof can include γ-butyrolactone, ethyl lactate, propylene glycol monomethyl ether, propylene glycol monoethyl ether, and propylene glycol monomethyl ether acetate.

The solvent is added in an amount of preferably 50 to 1,000 parts by mass to 100 parts by mass of the hydroxypolyamide. The amount of the solvent defined in this range is preferable because it can provide a viscosity suitable for both a coating applicator and a coating thickness and thus easily produce a cured relief pattern.

<Process for Producing Cured Relief Pattern and Semiconductor Device>

Then, a process for producing the cured relief pattern of the present invention is specifically described below.

First, the positive photosensitive resin composition of the present invention is coated on a substrate such as a silicon wafer, a ceramic substrate and an aluminium substrate by spin-coating using a spinner or by using a coater such as a dye coater and a roll coater. This is dried at 50 to 140° C. using an oven or hot plate to remove the solvent.

Second, the resultant substrate is subjected to exposure to actinic rays via a mask using a contact aligner or a stepper, or directly irradiated with light, electron beams or ion beams.

Third, the exposed or irradiated areas are eluted and removed with a developing solution, followed by rinsing with a rinse to provide a desired relief pattern. Examples of a developing method can include spray, paddle, dipping, and ultrasonic methods. Distilled water, deionized water, or the like may be used as the rinse.

The developing solution used to develop the film formed by the positive photosensitive resin composition of the present invention is intended to dissolve and remove the hydroxypolyamide and is required to be an alkaline aqueous solution in which an alkali compound is dissolved. The alkali compound dissolved in the developing solution may be an inorganic alkali compound or an organic alkali compound.

Examples of the inorganic alkali compound include lithium hydroxide, sodium hydroxide, potassium hydroxide, diammonium hydrogen phosphate, dipotassium hydrogen phosphate, disodium hydrogen phosphate, lithium silicate, sodium silicate, potassium silicate, lithium carbonate, sodium carbonate, potassium carbonate, lithium borate, sodium borate, potassium borate, and ammonia.

Examples of the organic alkali compound include tetramethylammonium hydroxide, tetraethylammonium hydroxide, trimethylhydroxyethylammonium hydroxide, methylamine, dimethylamine, trimethylamine, monoethylamine, diethylamine, triethylamine, n-propylamine, di-n-propylamine, isopropylamine, diisopropylamine, methyldiethylamine, dimethylethanolamine, ethanolamine, and triethanolamine.

In addition, the alkaline aqueous solution may optionally contain appropriate amounts of a water-soluble organic solvent (e.g., methanol, ethanol, propanol, or ethylene glycol), a surfactant, a storage stabilizer, a dissolution inhibitor for the resin, and the like.

Last, the resultant relief pattern is subjected to heat treatment to form a cured relief pattern composed of a resin having a polybenzoxazole structure.

The semiconductor device of the present invention can be produced by combining a known process for producing a semiconductor with the use of the cured relief pattern of the present invention as a surface protection film, an interlayer insulating film, an insulating film for rewiring, a protection film for a flip-chip device, or a protection film for a device having a bump structure.

The positive photosensitive resin composition of the present invention is also useful in the field of interlayer insulation of multilayered circuit, a cover coat for flexible copper-clad laminate, a solder mask film, a liquid crystal alignment layer, or the like.

EXAMPLES

The present invention will be more specifically described with reference to Reference Examples, Examples and Comparative Example.

<Synthesis of Hydroxypolyamide>

Reference Example 1

In a 2-liter separable flask were mixed and stirred 197.8 g (0.54 mole) of 2,2-bis(3-amino-4-hydroxyphenyl)-hexafluoropropane, 75.9 g (0.96 mole) of pyridine and 692 g of DMAc at room temperature (25° C.) for dissolution. To the resultant mixture was dropwise added, through a dropping funnel, a mixed solution in which 19.7 g (0.12 mole) of 5-norbornene-2,3-dicarboxylic anhydride was separately dissolved in 88 g of DMDG. The time required for the dropwise addition was 40 minutes, and the reaction solution temperature was up to 28° C.

After the dropwise addition, the flask was warmed to 50° C. in a hot water bath and stirred for 18 hours, followed by measuring the IR spectrum for the reaction solution to identify the appearance of the characteristic absorptions of imide group at 1,385 cm$^{-1}$ and 1,772 cm$^{-1}$.

Subsequently, the flask was cooled to 8° C. in a water bath, to which was then dropwise added, through a dropping funnel, a mixed solution in which 142.3 g (0.48 mole) of 4,4'-diphenylether dicarboxylic acid dichloride was separately dissolved in 398 g of DMDG. The time required for the dropwise addition was 80 minutes, and the reaction solution temperature was up to 12° C. Three hours after the dropwise addition, the reaction solution was dropwise added to 12 l of water under high-speed stirring to disperse and precipitate a polymer. The purified precipitate was recovered, washed with water appropriately, dewatered, and subjected to vacuum drying to provide a hydroxypolyamide (P-1). The hydroxypolyamide thus synthesized had a weight average molecular weight of 14,000 in polystyrene equivalent as measured by gel permeation chromatography (GPC). The analysis conditions for GPC are described below.

Column: Shodex (trade name) 805/804/803 columns (manufactured by Showa Denko KK) connected in series Eluent: tetrahydrofuran, 40° C.

Flow rate: 1.0 ml/minute

Detector: Shodex (trade name) RI SE-61 manufactured by Showa Denko KK

<Synthesis of Photo-Acid Generator>

Reference Example 2

In a 1-litter separable flask were placed 109.9 g (0.3 mole) of 2,2-bis(3-amino-4-hydroxyphenyl)-hexafluoropropane, 330 g of tetrahydrofuran (THF) and 47.5 g (0.6 mole) of pyridine, to which 98.5 g (0.6 mole) of 5-norbornene-2,3-dicarboxylic anhydride was then added, at room temperature, in the form of powder as it is. A stirring reaction was then conducted at room temperature in the above state for 3 days before identifying the reaction by high performance liquid chromatography (HPLC), resulting in detecting a product with a purity of 99% as a single peak without detecting any raw material. This reaction solution was directly added dropwise to 1 L of ion exchanged water under stirring before filtering the precipitate, to which 500 mL of THF was then added with stirring to dissolve it. The resultant homogeneous solution was passed through a glass column packed with 100 g of Amberlyst 15, a cation exchange resin (from Organo Co., Ltd.) to remove the remaining pyridine. Subsequently, this solution was added dropwise to 3 litters of ion exchanged water under high-speed stirring to precipitate a product, which was then filtered before vacuum drying.

Imidation in the product was identified by the appearance of characteristic absorptions of the imide group at 1,394 cm$^{-1}$ and 1,774 cm$^{-1}$ in the IR spectrum, and the absence of characteristic absorptions of the amide group near 1,540 cm$^{-1}$ and 1,650 cm$^{-1}$ and further the absence of peaks of protons of amide and carboxylic acid in the NMR spectrum.

To 560 g of acetone were then added 65.9 g (0.1 mole) of the above-described product and 53.7 g (0.2 mole) of 1,2-naphthoquinonediazide-4-sulfonyl chloride, followed by stirring and dissolving at 20° C. To this solution was dropwise added 21.2 g (0.21 mole) of triethylamine diluted with 106.2 g of acetone at a constant speed over a period of 30 minutes. Here, the reaction solution was temperature controlled in the range from 20 to 30° C. in an ice-water bath or the like.

After the dropwise addition, the resultant mixture was further stirred at 20° C. for 30 minutes and allowed to stand before throwing, thereinto at a time, 5.6 g of a hydrochloric acid aqueous solution having a concentration of 36% by weight. The reaction solution was then cooled in an ice-water bath, followed by sucking and filtering off the precipitated solid. The resultant filtrate was added dropwise to 5 litters of a hydrochloric acid aqueous solution having a concentration of 0.5 wt % under stirring over a period of one hour to precipitate the desired material, which was then recovered by suction filtration. The recovered cake-like material was again dispersed in 5 litters of ion-exchanged water, followed by stirring, washing, and filtering for recovery; this water-washing operation was repeated thrice. Finally, the obtained cake-like material was vacuum dried at 40° C. for 24 hours to provide a photosensitive diazoquinone compound (Q-1).

<Preparation of Positive Photosensitive Resin Composition>

Examples 1 to 31 and Comparative Example 1

A hundred parts by mass of the hydroxypolyamide (P-1) obtained in the Reference Example 1, and predetermined parts by mass of each of the photosensitive diazoquinone compound (Q-1) obtained in the Reference Example 2 and the terpene compound of each of C-1 to C-29 (Examples 1 to 31) were dissolved in 170 parts by mass of GBL, and the resulting solution was filtered using a filter having a pore size of 0.2 μm to prepare a positive photosensitive resin composition of each of Examples 1 to 31 and Comparative Examples described in Table 1.

(C-1) Geraniol
(C-2) Nerol
(C-3) Citronellol
(C-4) Linalool
(C-5) Menthol
(C-6) Terpineol
(C-7) Geranyl Acetate
(C-8) Neryl Acetate
(C-9) Citronellyl Acetate
(C-10) Linalyl Acetate
(C-11) Menthyl Acetate
(C-12) Isobornyl Acetate
(C-13) Citronellic Acid
(C-14) Linalool Oxide
(C-15) Nerolidol
(C-16) Terpinene
(C-17) Ionone
(C-18) Citronellic Acid+Linalool
(C-19) Citronellic Acid+Linalyl Acetate
(C-20) Citronellic Acid+Nerol
(C-21) Citronellic Acid+Geraniol
(C-22) Citronellic Acid+Nerolidol
(C-23) Citronellic Acid+Linalool Oxide
(C-24) Citronellic Acid+Citronellol
(C-25) Citronellic Acid+Terpinene-4-ol
(C-26) Citronellic Acid+Menthol
(C-27) Linalool+Linalool Oxide
(C-28) Linalool+Nerolidol
(C-29) Linalool Oxide+Nerolidol <Evaluation of Positive Photosensitive Resin Composition>

(1) Evaluation of Patterning Property

Each of the positive photosensitive resin compositions obtained in the above Examples and Comparative Example was spin-coated on a 5-inch silicone wafer using a spin coater (Dspin636 (trade name) manufactured by Dainippon Screen Mfg. Co., Ltd.), which was then prebaked on a hot plate at 120° C. for 180 seconds to form a coating film having a thickness of 11.5 μm. The film thickness was measured using a film thickness measuring apparatus (Lambda Ace: manufactured by Dainippon Screen Mfg. Co., Ltd.).

The coating film was exposed through a reticle having a test pattern by changing light exposure in stages using a stepper (NSR2005i8A: manufactured by Nikon Corporation) having i-beam exposure wavelength (365 nm). The exposed coating film was developed at 23° C. using an alkali developing solution (AZ300MIF Developer: a 2.38% by mass tetramethylammonium hydroxide aqueous solution manufactured by Clariant Japan KK) while adjusting the developing time so as to provide a film thickness of 9.8 μm after development, followed by rinsing with pure water to form a positive relief pattern. The sensitivity, resolution and peeling state of each positive photosensitive resin composition are shown in Table 2.

The sensitivity and resolution of the positive photosensitive resin composition were evaluated as follows.

Sensitivity (mJ/cm²):
The minimum exposure dose capable of completely dissolving and removing the exposed areas of the coating film in the above developing time Resolution (μm):
The minimum resolved pattern size with the above exposure dose Peeling:
Whether the peeling of a 10-μm pattern is present with the above exposure dose or not.

TABLE 1

| | Hydroxy-polyamide | Photo-acid Generator | Terpene Compound |
|---|---|---|---|
| Example 1 | P-1 | Q-1 (18 parts by mass) | C-1 (15 parts by mass) |
| Example 2 | P-1 | Q-1 (18 parts by mass) | C-2 (15 parts by mass) |
| Example 3 | P-1 | Q-1 (18 parts by mass) | C-3 (15 parts by mass) |
| Example 4 | P-1 | Q-1 (18 parts by mass) | C-4 (15 parts by mass) |
| Example 5 | P-1 | Q-1 (18 parts by mass) | C-5 (15 parts by mass) |
| Example 6 | P-1 | Q-1 (18 parts by mass) | C-6 (15 parts by mass) |
| Example 7 | P-1 | Q-1 (18 parts by mass) | C-7 (15 parts by mass) |
| Example 8 | P-1 | Q-1 (18 parts by mass) | C-8 (15 parts by mass) |
| Example 9 | P-1 | Q-1 (18 parts by mass) | C-9 (15 parts by mass) |
| Example 10 | P-1 | Q-1 (18 parts by mass) | C-10 (15 parts by mass) |
| Example 11 | P-1 | Q-1 (18 parts by mass) | C-10 (30 parts by mass) |
| Example 12 | P-1 | Q-1 (18 parts by mass) | C-11 (15 parts by mass) |
| Example 13 | P-1 | Q-1 (18 parts by mass) | C-12 (15 parts by mass) |
| Example 14 | P-1 | Q-1 (18 parts by mass) | C-13 (15 parts by mass) |
| Example 15 | P-1 | Q-1 (18 parts by mass) | C-14 (15 parts by mass) |
| Example 16 | P-1 | Q-1 (18 parts by mass) | C-15 (15 parts by mass) |
| Example 17 | P-1 | Q-1 (18 parts by mass) | C-15 (30 parts by mass) |
| Example 18 | P-1 | Q-1 (18 parts by mass) | C-16 (15 parts by mass) |
| Example 19 | P-1 | Q-1 (18 parts by mass) | C-17 (15 parts by mass) |
| Example 20 | P-1 | Q-1 (18 parts by mass) | C-18 (15 parts by mass each) |
| Example 21 | P-1 | Q-1 (18 parts by mass) | C-19 (15 parts by mass each) |
| Example 22 | P-1 | Q-1 (18 parts by mass) | C-20 (15 parts by mass each) |
| Example 23 | P-1 | Q-1 (18 parts by mass) | C-21 (15 parts by mass each) |
| Example 24 | P-1 | Q-1 (18 parts by mass) | C-22 (15 parts by mass each) |
| Example 25 | P-1 | Q-1 (18 parts by mass) | C-23 (15 parts by mass each) |
| Example 26 | P-1 | Q-1 (18 parts by mass) | C-24 (15 parts by mass each) |
| Example 27 | P-1 | Q-1 (18 parts by mass) | C-25 (15 parts by mass each) |
| Example 28 | P-1 | Q-1 (18 parts by mass) | C-26 (15 parts by mass each) |
| Example 29 | P-1 | Q-1 (18 parts by mass) | C-27 (15 parts by mass each) |
| Example 30 | P-1 | Q-1 (18 parts by mass) | C-28 (15 parts by mass each) |
| Example 31 | P-1 | Q-1 (18 parts by mass) | C-29 (15 parts by mass each) |
| Comparative Example 1 | P-1 | Q-1 (18 parts by mass) | None |

TABLE 2

| | Sensitivity | Resolution | Peeling |
|---|---|---|---|
| Example 1 | 225 | 3 | No |
| Example 2 | 230 | 3 | No |
| Example 3 | 225 | 3 | No |
| Example 4 | 245 | 3 | No |
| Example 5 | 245 | 3 | No |
| Example 6 | 250 | 3 | No |
| Example 7 | 250 | 3 | No |
| Example 8 | 260 | 3 | No |
| Example 9 | 265 | 3 | No |
| Example 10 | 240 | 3 | No |
| Example 11 | 225 | 3 | No |
| Example 12 | 255 | 3 | No |
| Example 13 | 260 | 3 | No |
| Example 14 | 225 | 3 | No |
| Example 15 | 260 | 3 | No |
| Example 16 | 240 | 3 | No |
| Example 17 | 220 | 3 | No |
| Example 18 | 310 | 3 | No |

TABLE 2-continued

|  | Sensitivity | Resolution | Peeling |
|---|---|---|---|
| Example 19 | 330 | 3 | No |
| Example 20 | 205 | 3 | No |
| Example 21 | 210 | 3 | No |
| Example 22 | 215 | 3 | No |
| Example 23 | 210 | 3 | No |
| Example 24 | 200 | 3 | No |
| Example 25 | 225 | 3 | No |
| Example 26 | 210 | 3 | No |
| Example 27 | 230 | 3 | No |
| Example 28 | 220 | 3 | No |
| Example 29 | 250 | 3 | No |
| Example 30 | 240 | 3 | No |
| Example 31 | 245 | 3 | No |
| Comparative Example 1 | 425 | 3 | Yes |

INDUSTRIAL APPLICABILITY

The positive photosensitive resin composition of the present invention can be suitably used as a surface protection film, interlayer insulating film and insulating film for rewiring for semiconductor devices, a protection film for flip-chip devices, a protection film for devices having a bump structure, an interlayer insulating film for multilayered circuits, a cover coat for flexible copper-clad laminate, a solder mask film, a liquid crystal alignment film, and the like.

The invention claimed is:

1. A positive photosensitive resin composition, characterized by comprising 1 to 50 parts by mass of a photo-acid generator and 0.01 to 70 parts by mass of a terpene compound in combination with 100 parts by mass of a hydroxypolyamide having repeating units represented by the general formula (1) below:

[Formula 1]

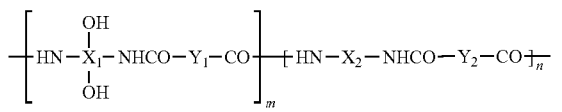

(1)

wherein $X_1$ represents a tetravalent organic group having at least two carbon atoms; $X_2$, $Y_1$ and $Y_2$ each independently represent a divalent organic group having at least two carbon atoms; m represents an integer of 2 to 1,000; n represents an integer of 0 to 500; $m/(m+n) > 0.5$; and m units of dihydroxydiamide containing $X_1$ and $Y_1$ and n units of diamide containing $X_2$ and $Y_2$ may be sequenced in any order.

2. The positive photosensitive resin composition according to claim 1, characterized in that the terpene compound is a compound having at least one functional group selected from the group consisting of an alcoholic hydroxyl group, a carbonyl group, a carboxyl group, an ester group, and an ether group.

3. The positive photosensitive resin composition according to claim 2, characterized in that the terpene compound is a compound having at least one functional group selected from the group consisting of an alcoholic hydroxyl group, a carboxyl group, and an ester group.

4. The positive photosensitive resin composition according to claim 1, characterized in that the terpene compound is an open-chain terpene.

5. The positive photosensitive resin composition according to claim 1, characterized in that the terpene compound is a mixture of at least two compounds including any one compound selected from the group consisting of citronellic acid and linalool and a compound having any one functional group selected from the group consisting of an alcoholic hydroxyl group, a carboxyl group, and an ester group.

6. The positive photosensitive resin composition according to claim 1, characterized in that the photo-acid generator is a compound having a naphthoquinonediazide structure.

7. A process for producing a cured relief pattern, characterized by comprising: (1) forming the positive photosensitive resin composition according to claim 1 in the form of a layer or film on a substrate, (2) exposing the substrate to actinic rays via a mask or directly irradiating the substrate with light, electron beams or ion beams, (3) eluting and removing the exposed or irradiated areas with a developing solution, and (4) subjecting the resultant relief pattern to heat treatment.

8. A semiconductor device characterized by having a cured relief pattern layer obtained by the process according to claim 7.

9. The positive photosensitive resin composition according to claim 2, characterized in that the terpene compound is an open-chain terpene.

10. The positive photosensitive resin composition according to claim 3, characterized in that the terpene compound is an open-chain terpene.

11. The positive photosensitive resin composition according to claim 2, characterized in that the terpene compound is a mixture of at least two compounds including any one compound selected from the group consisting of citronellic acid and linalool and a compound having any one functional group selected from the group consisting of an alcoholic hydroxyl group, a carboxyl group, and an ester group.

12. The positive photosensitive resin composition according to claim 3, characterized in that the terpene compound is a mixture of at least two compounds including any one compound selected from the group consisting of citronellic acid and linalool and a compound having any one functional group selected from the group consisting of an alcoholic hydroxyl group, a carboxyl group, and an ester group.

13. The positive photosensitive resin composition according to claim 4, characterized in that the terpene compound is a mixture of at least two compounds including any one compound selected from the group consisting of citronellic acid and linalool and a compound having any one functional group selected from the group consisting of an alcoholic hydroxyl group, a carboxyl group, and an ester group.

14. The positive photosensitive resin composition according to claim 2, characterized in that the photo-acid generator is a compound having a naphthoquinonediazide structure.

15. The positive photosensitive resin composition according to claim 3, characterized in that the photo-acid generator is a compound having a naphthoquinonediazide structure.

16. The positive photosensitive resin composition according to claim 4, characterized in that the photo-acid generator is a compound having a naphthoquinonediazide structure.

17. The positive photosensitive resin composition according to claim 5, characterized in that the photo-acid generator is a compound having a naphthoquinonediazide structure.

18. A process for producing a cured relief pattern, characterized by comprising: (1) forming the positive photosensitive resin composition according to claim 2 in the form of a layer or film on a substrate, (2) exposing the substrate to actinic rays via a mask or directly irradiating the substrate with light, electron beams or ion beams, (3) eluting and removing the exposed or irradiated areas with a developing solution, and (4) subjecting the resultant relief pattern to heat treatment.

19. A process for producing a cured relief pattern, characterized by comprising: (1) forming the positive photosensitive resin composition according to claim 3 in the form of a layer or film on a substrate, (2) exposing the substrate to actinic rays via a mask or directly irradiating the substrate with light, electron beams or ion beams, (3) eluting and removing the exposed or irradiated areas with a developing solution, and (4) subjecting the resultant relief pattern to heat treatment.

\* \* \* \* \*